United States Patent [19]

Mori et al.

[11] Patent Number: 5,241,605
[45] Date of Patent: Aug. 31, 1993

[54] TONE CONTROL APPARATUS FOR FRONT AND REAR CHANNELS

[75] Inventors: Shuichi Mori; Hisashi Kihara; Shinjiro Kato; Fumio Tamura, all of Kawagoe, Japan

[73] Assignee: Pioneer Electronic Corporation, Tokyo, Japan

[21] Appl. No.: 599,052

[22] Filed: Oct. 17, 1990

[30] Foreign Application Priority Data

Dec. 28, 1989 [JP] Japan .................. 1-344056

[51] Int. Cl.⁵ .............................................. H03G 5/00
[52] U.S. Cl. ..................................... 381/101; 381/24; 381/102; 381/103
[58] Field of Search ............. 381/103, 101, 98, 102-24

[56] References Cited

U.S. PATENT DOCUMENTS

| 4,736,426 | 4/1988 | Kinoshita et al. ............... 381/98 |
| 4,845,758 | 7/1989 | Op de Beek et al. ............ 381/103 |
| 4,888,809 | 12/1989 | Knibbeler ........................ 381/103 |

FOREIGN PATENT DOCUMENTS

| 0416277 | 3/1991 | European Pat. Off. ............ 381/103 |
| 2346804B2 | 3/1976 | Fed. Rep. of Germany . |
| 3243338A1 | 5/1984 | Fed. Rep. of Germany . |
| 2937011C2 | 5/1987 | Fed. Rep. of Germany . |

*Primary Examiner*—Jin F. Ng
*Assistant Examiner*—Nina Tong
*Attorney, Agent, or Firm*—Perman & Green

[57] ABSTRACT

A tone control apparatus for a sound system processing audio signals of front and rear channels. By providing front and rear tone control means for independently effecting the tone control in both of the front and rear channels, it is possible to prevent the generation of distortions in the front acoustic output when the control for raising the rear bass level is effected. Also, a tone control balance between the front and rear channels in a vehicle cabin, for example, can be set appropriately.

5 Claims, 7 Drawing Sheets

Fig. 3

| ADDRESS | COEFFICIENT DATA |
|---|---|
| 1 | $C_2$ |
| 2 | $C_1$ |
| 3 | $C_0$ |
| 4 | $C_4$ |
| 5 | $C_3$ |

Fig. 4

| BASS COEFFICIENT DATA GROUPS | TREBLE COEFFICIENT DATA GROUPS |
|---|---|
| B(+12dB) | T(+12dB) |
| B(+10dB) | T(+10dB) |
| B(+10dB) | T(+8dB) |
| ⋮ | ⋮ |
| B(−10dB) | T(−10dB) |
| B(−12dB) | T(−12dB) |

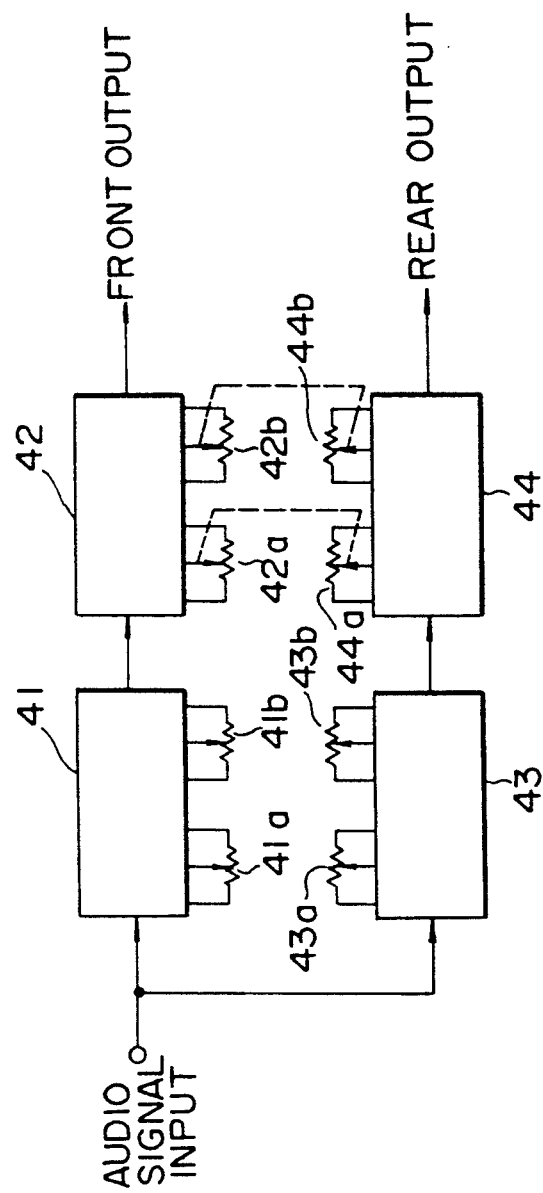

5,241,605

TONE CONTROL APPARATUS FOR FRONT AND REAR CHANNELS

BACKGROUND OF THE INVENTION

1. Field of the Invention

The present invention relates to a tone control apparatus and, more particularly, to a tone control apparatus in a sound system having audio signal outputs of front and rear channels.

2. Description of Background Information

As a tone control apparatus, it is a general way to control treble (high frequency sound) and bass (low frequency sound) levels in accordance with key operations. In the case of tone control apparatuses provided in a sound system having audio outputs of a plurality of channels, the tone control is performed in such a manner that the same frequency response characteristic is used for all of the channels.

In what is called a 4-speaker accommodating onboard (for mounting in a vehicle) sound system in which each of the front and rear channels has audio outputs of the right and left channels, generally, speakers of a small diameter are arranged on the front side and speakers of a relatively larger diameter are arranged on the rear side because of restrictions on the mounting of speakers in the vehicle cabin In the tone control apparatus provided in such an onboard type sound system, the user may operate a bass tone control knob to raise the bass level of the sound outputs for instance in order to compensate the insufficiency of the bass sound. In such a case, although the bass level in the whole acoustic outputs can be increased, a problem arises that the front speakers produce distortions of large degrees while the permissive driving power of the speakers are exceeded because of the small diameter of the front speakers mentioned before. On the other hand, if the user raises the treble level of the sound outputs by operating a treble control knob because of the insufficiency of the treble sound at the front seat, a problem arises such that, the sound level of the treble range becomes excessively high for passengers sitting on the rear seat because of the nearness of the rear speakers and the rear seats, giving an unpleasant feeling.

OBJECT AND SUMMARY OF THE INVENTION

It is an object of the present invention to provide a tone control apparatus in a sound system having audio outputs of the front and rear channels, in which the bass level can be adjusted without distorting the acoustic output from front speakers and the treble level can be adjusted without giving any unpleasant feeling to a listener sitting near rear speakers.

A tone control circuit according to the invention is provided as a tone control apparatus in a sound system for generating audio outputs of the front and rear channels, wherein the tone control circuit has front and rear tone control means for independently adjusting the tone in the front and rear channels.

BRIEF DESCRIPTION OF THE DRAWINGS

FIG. 3 is a diagram showing coefficient data areas in a coefficient RAM;

FIG. 4 is a diagram showing a plurality of coefficient data groups stored in a memory in a microcomputer;

FIG. 8 is a block diagram showing an embodiment in the case where the apparatus according to the present invention is constructed by using analog circuits.

DETAILED DESCRIPTION OF THE PREFERRED EMBODIMENT

An embodiment of the present invention will be described in detail hereinafter with reference to the accompanying drawings.

Figure 1:
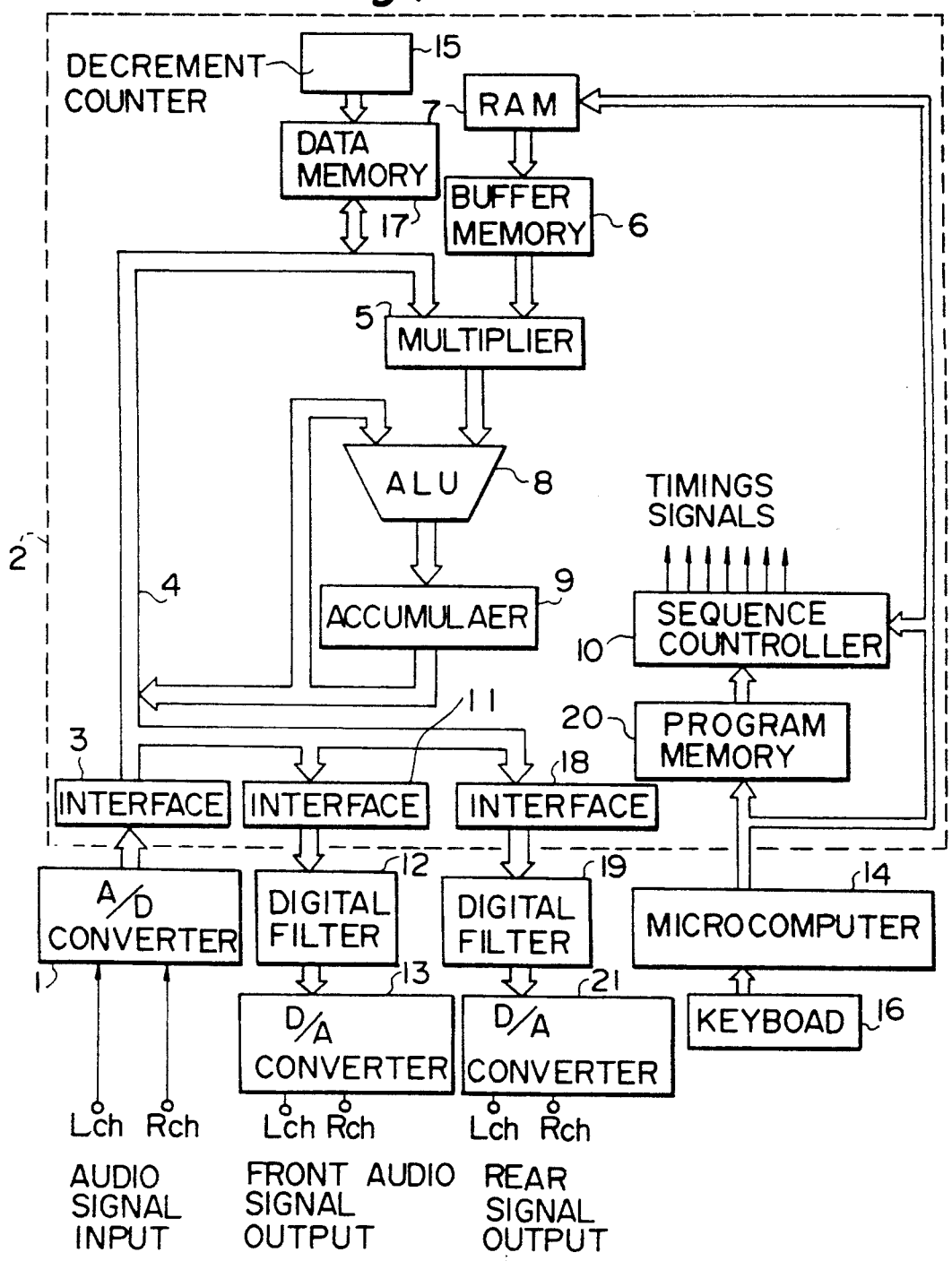
FIG. 1 is a block diagram showing an embodiment of the present invention.

In a tone control apparatus as an embodiment of the invention shown in FIG. 1, a DSP (digital signal processor) 2 is employed. Analog audio signals of the left and right channels (L-ch, R-ch) are supplied to an input interface 3 in the DSP 2 through an A/D converter 1. A data bus 4 is connected to the input interface 3, a data memory 17 for temporarily storing a group of data, and one of input terminals of a multiplier 5. A decrement counter 15 for subtracting a "1" from a read address of the data memory 17 every one sampling period is connected to the data memory 17. A buffer memory 6 for holding coefficient data is connected to the other input of the multiplier 5. A coefficient RAM 7 is connected to the buffer memory 6. A plurality of coefficient data are stored in the RAM 7. A coefficient data is sequentially read out from the group of coefficient data stored in the RAM 7 in response to a timing signal from a sequence controller 10, which will be explained later. The read-out coefficient data is supplied to the buffer memory 6 and held therein. The coefficient data held in the buffer memory 6 is in turn supplied to the multiplier 5. An ALU (adder) 8 is provided to accumulate the calculation output of the multiplier 5. The calculation output of the multiplier 5 is supplied to one input of the ALU 8 and the other input is connected to the data bus 4. An accumulator 9 is connected to a calculation output of the ALU 8. An output of the accumulator 9 is connected to the data bus 4.

On the other hand, an output interface 11 is connected to the data bus 4. A digital audio signal which is output from the output interface 11 is supplied to a D/A converter 13 through a digital filter 12. Audio signals of the front channel are output from the D/A converter 13. Similarly, an output interface 18 is connected to the data bus 4. Digital audio signals which are output from the output interface 18 are supplied to a D/A converter 21 via a digital filter 19. Audio signals of the rear channels are output from the D/A converter 21.

The operations of the A/D converter 1, interfaces 3 and 11, multiplier 5, coefficient RAM 7, ALU 8, accumulator 9, and digital filter 19 are controlled by the sequence controller 10. The sequence controller 10 operates in accordance with processing programs written in a program memory 20 and also operates in accordance with commands from a microcomputer 14.

A keyboard 16 is connected to the microcomputer 14. The keyboard 16 has up/down control keys for adjusting the bass level, up/down control keys for adjusting the treble level, and a tone control mode selection key (all of these keys are not shown). In accordance with the operations of the above keys, the microcomputer 14 controls the writing operation of the coefficient data of the RAM 7.

In such a construction, the audio signals which are supplied to the A/D converter 1 are converted into the digital audio signal data every predetermined sampling period and are supplied into the data memory 17 and stored therein, via the input interface 3. On the other hand, the coefficient data which was read out from the RAM 7 is supplied to the buffer memory 6 and held therein. The sequence controller 10 sets various timings such as a timing to read data from the interface 3, a timing to selectively transfer the data from the data memory 17 to the multiplier 5, a timing to output each coefficient data from the RAM 7, a timing for the multiplying operation of the multiplier 5, a timing for the summing operation of the ALU 8, an output timing of the accumulator 9, timings to output data of the calculation results from the interfaces 11 and 18, and the like. By setting the above timings appropriately, for instance, coefficient data $a_1$ from the buffer memory 6 and data $d_1$ from the data memory 17 are supplied to the multiplier 5 and $a_1 \cdot d_1$ is at first calculated by the multiplier 5. After $a_1 \cdot d_1$ has been calculated, $0 + a_1 \cdot d_1$ is calculated by the ALU 8 and the calculation result is held in the accumulator 9. Then, when coefficient data $a_2$ is output from the buffer memory 6 and data $d_2$ is output from the data memory 17, $a_2 \cdot d_2$ is calculated by the multiplier 5 and the calculation result is input to the ALU 8. At the same time, $a_1 \cdot d_1$ output from the accumulator 9 is supplied to the ALU 8. Thus, $a_1 \cdot d_1 + a_2 \cdot d_2$ is calculated by the ALU 8 and the calculation result is held in the accumulator 9. By repeating the above operations, $\Sigma a_i \cdot d_i$ is calculated.

Figure 2:
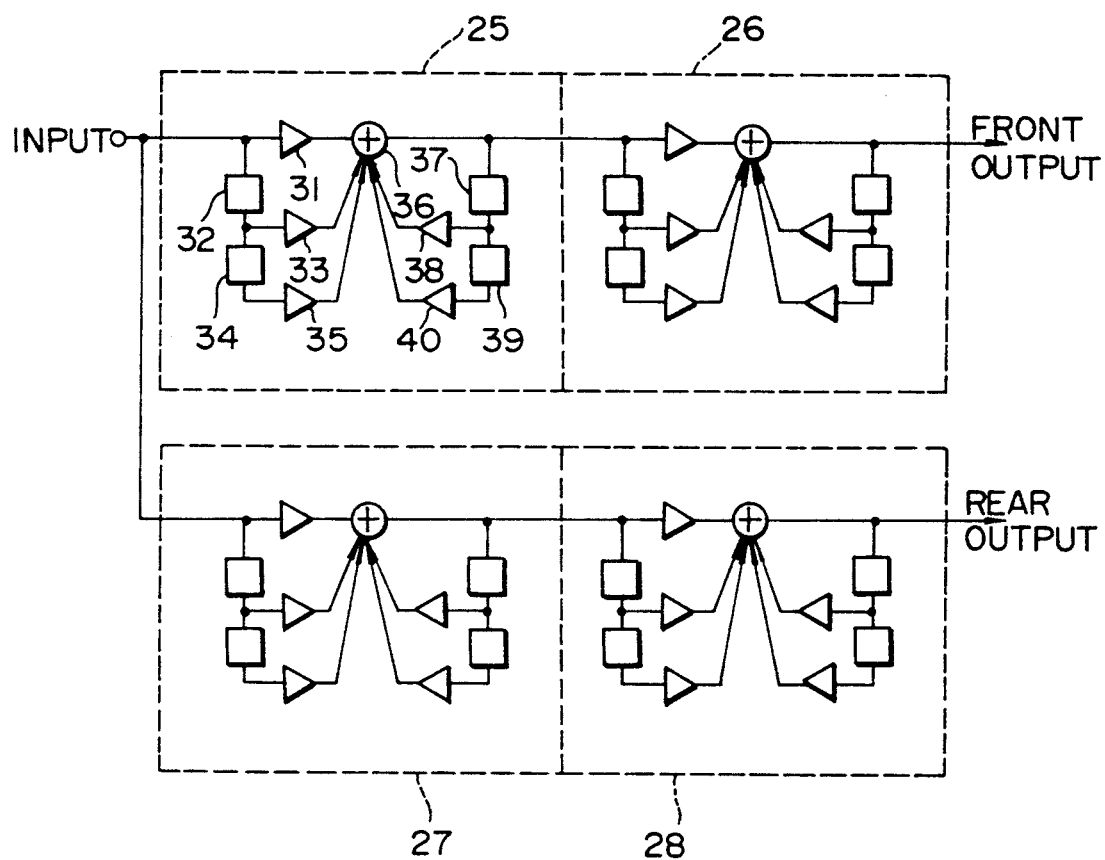
FIG. 2 is a block diagram showing an equivalent circuit which performs operations executed by the calculation processes in an apparatus of FIG. 1.

The operations of the DSP 2 in the tone control apparatus according to the invention can be expressed by an equivalent circuit as shown in FIG. 2. Specifically, the equivalent circuit comprises: a bass level control circuit 25 and a treble level control circuit 26 for the front channel; and a bass level control circuit 27 and a treble level control circuit 28 for the rear channel. Each of the circuits 25 through 28 is constructed by a filter of secondary IIR type. The bass level control circuit 25 will now be described. A coefficient multiplier 31 and a delay element 32 are connected to an input terminal to which a data signal is supplied. A coefficient multiplier 33 and a delay element 34 are connected to an output of the delay element 32. Further, a coefficient multiplier 35 is connected to an output of the delay element 34. Outputs of the coefficient multipliers 31, 33, and 35 are connected to an adder 36. The treble level control circuit 26 is connected to an output of the adder 36, to which a delay element 37 is also connected. A coefficient multiplier 38 and a delay element 39 are connected to an output of the delay element 37. A coefficient multiplier 40 is further connected to an output of the delay element 39. Outputs of the coefficient multipliers 38 and 40 are also connected to the adder 36.

Each of the delay times of the delay elements 32, 34, 37, and 39 is equal to the operation time of one step which is executed in response to a command from the sequence controller 10. Therefore, the data which is supplied to the multiplier 33 is data which is one step before the data which is supplied to the multiplier 31. The data which is supplied to the multiplier 35 is the data which is two steps before the data which is supplied to the multiplier 31. The same also apply to the multipliers 38 and 40. Coefficients which are multiplied by the multipliers 31, 33, 35, 38, and 40 correspond to coefficient data $c_0$ through $c_4$, which will be explained later.

In the case of forming the above-mentioned secondary IIR type filter by digital processes of the DSP 2, the DSP 2 operates in the following manner.

First, in the first step, input audio signal data $d_n$ is read out from an address n of the data memory 17, and the coefficient data $c_2$ is read out of the RAM 7, then $d_n$ and $c_2$ are transferred to the buffer memory 6 and multiplied by the multiplier 5. In the third step which is two steps after the first step, a "0" is added to the result of the multiplication $c_2 \cdot d_n$ by the ALU 8 and the result of the addition is held in the accumulator 9.

In the second step, signal data $d_{n-1}$ is read out from an address n−1 of the data memory 17, and the read-out signal data $d_{n-1}$ and the coefficient data $c_1$ which was newly read out of the RAM 7 are multiplied by the multiplier 5. The value (the result of summation in the third step) held in the accumulator 9 is added to the multiplication result $c_1 \cdot d_{n-1}$ by the ALU 8 and the result of summation is held in the accumulator 9 in the fourth step. Then, in the third step, input signal data IN is transferred from the interface 3 to an address n−2 of the data memory 17 and to the multiplier 5 and is multiplied to the coefficient data $c_0$ which was newly read out from the RAM 7, at the multiplier 5. In the fifth step, the value (the result of the addition in the fourth step) held in the accumulator 9 is added to the multiplication result $c_0 \cdot IN$ by the ALU 8 and the addition result is held in the accumulator 9.

In the fourth step, signal data $d_{n+2}$ is read out from address n+2 in the data memory 17, and the read-out signal data $d_{n+2}$ and the coefficient data $c_4$ which was newly read out of the RAM 7 are multiplied by the multiplier 5. In the sixth step, the value (the result of the addition in the fifth step) held in the accumulator 9 is added to the multiplication result $c_4 \cdot d_{n+2}$ by the ALU 8 and the result of the addition is held in the accumulator 9. In the fifth step 5, the signal data $d_{n+1}$ is read out from address n+1 of the data memory 17, and the read-out signal data $d_{n+1}$ and the read-out coefficient data $c_3$ are multiplied by the multiplier 5. In the seventh step, the value (the result of the addition in the sixth step) held in the accumulator 9 is added to the multiplication result $c_3 \cdot d_{n+1}$ by the ALU 8 and the addition result is held as output data into the accumulator 9 and is also written into address n of the data memory 17. The coefficient data $c_0$ through $c_4$ are read out from the internal memory (not shown) of the microcomputer 14 by a processor of the microcomputer 14 and are transferred to a predetermined coefficient data area in the RAM 7 as will be explained later. The coefficient data area is one area in the coefficient RAM 7. As such a coefficient data area, a front bass coefficient data area, a front treble coefficient data area, a rear bass coefficient data area, and a rear treble coefficient data area are formed in the coefficient RAM 7. Each area is configured, for instance, as shown in FIG. 3. The coefficient data $c_2$, $c_1$, $c_0$, $c_4$, and $c_3$ are sequentially read out from an address 1 and are sequentially written as one coefficient data group into the area by the microcomputer 14 in this order. Those coefficient data are sequentially read out by each coefficient data in the order of the addresses in accordance with the timing signals from the system controller 10.

As shown in FIG. 4, bass coefficient data groups B(+12 dB), B(+10 dB), B(+8 dB), . . . , B(−10 dB), and B($-12$ dB) are stored in the internal memory of the microcomputer 14 at 2 dB step. On the other hand, treble coefficient data groups T($+12$ dB), T($+10$ dB), T($+8$ dB), . . . , T($-10$ dB), and T($-12$ dB) are also stored in the similar manner. The above-mentioned coefficient data groups comprise the coefficient data $c_0$ to $c_4$ described before whose values are set for each date group.

Figure 5:
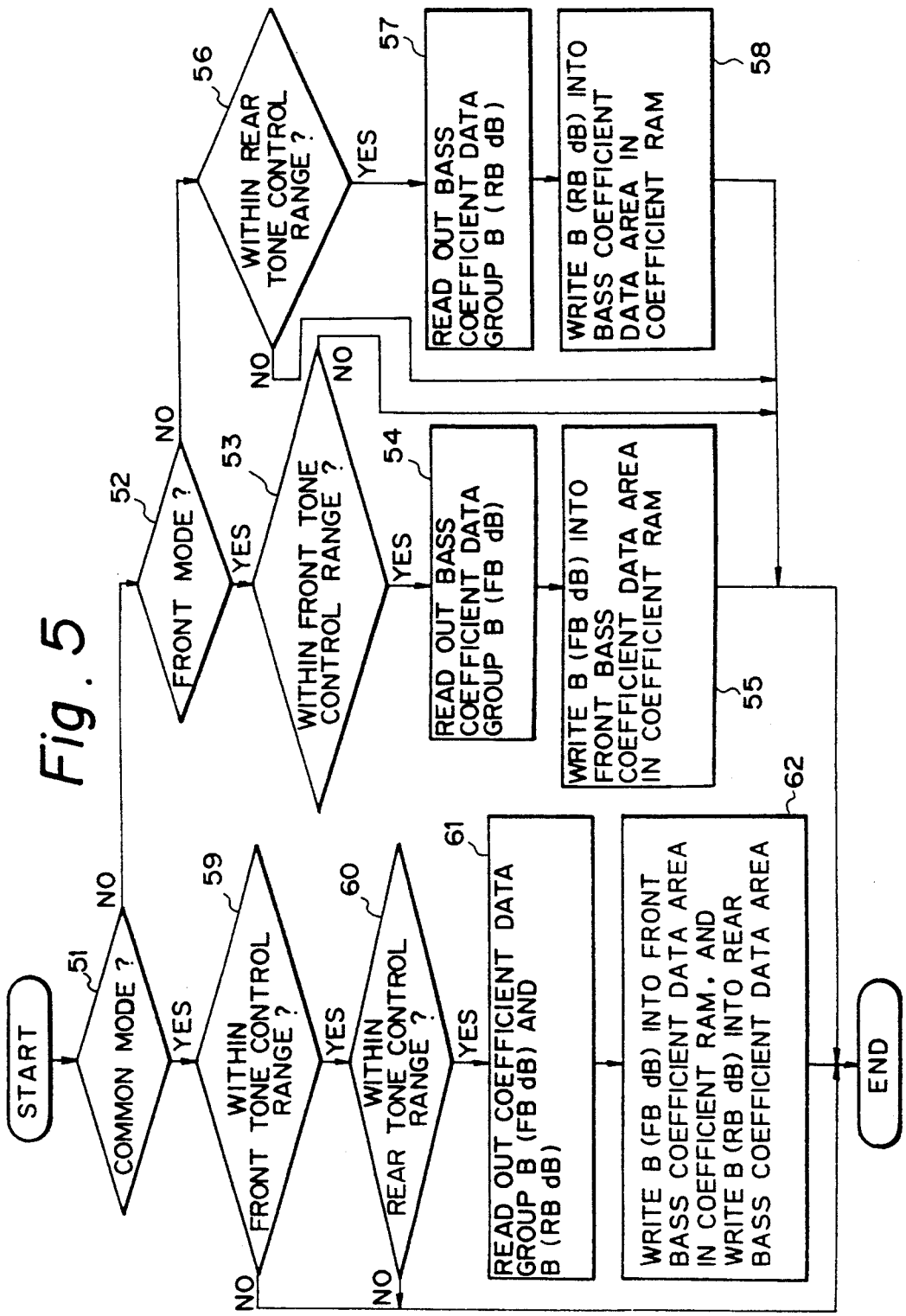
FIGS. 5 and 6 are flowcharts showing the operations of the microcomputer.
Figure 6:
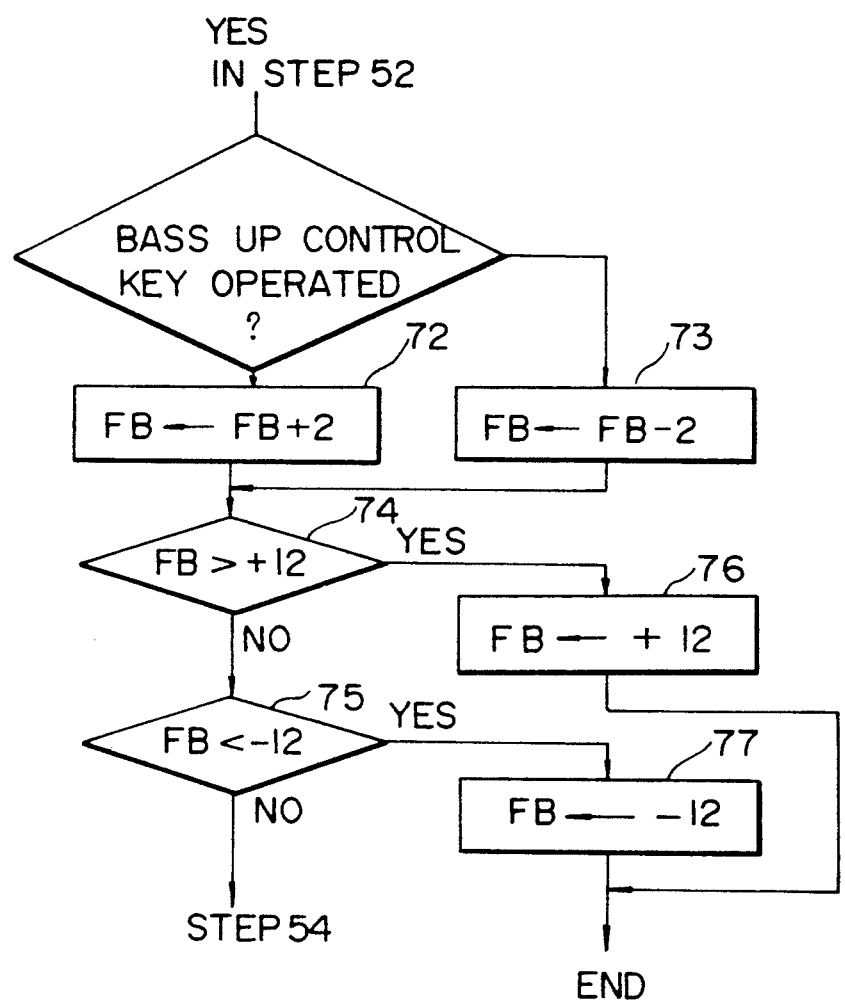

When the bass up/down control key of the keyboard 16 is depressed, the microcomputer 14 discriminates whether the tone control mode is a common mode or not, as shown in FIG. 5 (step 51). Such a discrimination is made by checking to see if the common mode has been selected by operating the tone control mode selection key of the keyboard 16 or not. Specifically, the tone control mode selection key can repetitively select one of the front mode to adjust the tone of the front sound, the rear mode to adjust the tone of the rear sound, and the common mode to adjust the tone of both front and rear sounds each time this key is operated. For instance, the present mode is determined by means of the content of a mode flag $F_M$ by constructing the mode flag $F_M$ in a manner such that its content changes by one among 1 to 3 each time the tone control mode selection key is operated. If the tone control mode is not the common mode, a check is made to see if it is the front mode or not (step 52). If it is the front mode, a check is made to see if the tone control level lies within an adjustable range of the front channels or not (step 53). In step 53, as shown in FIG. 6, a check is made to see if the up key of the bass up/down control keys has been operated in the front mode or not (step 71). If the up key has been operated, a front bass level variable FB is increased by "2" (step 72). If the bass down control key has been operated, the front bass level variable FB is decreased by "2" (step 73). A check is made to see if the front bass level variable FB is larger than the upper limit value $+12$ or not (step 74). A check is also made to see if the FB is smaller than the lower limit value $-12$ or not (step 75). If $-12 \leq FB \leq +12$, it means that the front tone control level lies within the adjustable range and a bass coefficient data group B (FB dB) corresponding to the front bass level variable FB is read out from the internal memory (step 54). The read-out bass coefficient data group B (FB dB) is transferred and written into the front bass coefficient data area of the coefficient RAM 7 (step 55). If $FB < -12$ or $FB > +12$, it means that the front tone control level is out of the adjustable range, So, the processing routine is finished by setting $FB = -12$ or $FB = +12$ (steps 76, 77).

If it is detected in step 52 that the tone control mode is not the front mode, the mode is the rear mode. Therefore, a check is made to see if the rear tone control level lies within the adjustable range or not (step 56). In step 56, in a manner similar to step 53, a rear bass level variable RB is increased by "2" each time the bass up control key is operated and the rear bass level variable RB is decreased by "2" each time the bass down control key is operated. Therefore, a check is made to see if the rear bass level variable RB is equal to or lower than the upper limit value $+12$ and is equal to or higher than the lower limit value $-12$. If $-12 \leq RB \leq +12$, the rear tone control level lies within the adjustable range. A bass coefficient data group B (RB dB) corresponding to the rear bass level variable RB is read out from the internal memory (step 57). The read-out bass coefficient data group B (RB dB) is transferred and written into the rear bass coefficient data area in the coefficient RAM 7 (step 58). If $RB < -12$ or $RB > +12$, the rear tone control level is out of the adjustable range, so that the processing routing is finished by setting $RB = -12$ or $RB = +12$. The initial values of the variables FB and RB are set to 0.

On the other hand, if the tone control mode is the common mode in step 51, in a manner similar to step 53, a check is made to see if the front tone control level lies within the adjustable range or not (step 59). If the front tone control level lies within the adjustable range, in a manner similar to step 56, a check is made to see if the rear tone control level lies within the adjustable range or not (step 60). If the rear tone control level lies within the adjustable range, the bass coefficient data group B (FB dB) according to the front bass level variable FB is read out from the internal memory and the bass coefficient data group B (RB dB) corresponding to the rear bass level variable RB is read out from the internal memory (step 61). The read-out bass coefficient data group B (FB dB) is transferred and written into the front bass coefficient data area of the coefficient RAM 7 and the bass coefficient data group B (RB dB) is transferred and written into the rear bass coefficient data area in the coefficient RAM 7 (step 62).

If it is determined that the front tone control level is out of the adjustable range in step 59, FB is set to $-12$ when $FB < -12$ and FB is set to $+12$ when $FB > +12$, then the processing routine is finished. On the other hand, if it is decided that the rear tone control level is out of the adjustable range in step 60, the front bass level variable FB (not shown) is returned to the original value by the change amount which was determined in step 59. When $RB < -12$, RB is set to $-12$ and RB is set to $+12$ when $RB > +12$, then the processing routine is finished.

In short, in the front mode, each time the bass up/down control key is operated, the front bass level variable FB is changed by two. If the front tone control level lies within the adjustable range, the bass coefficient data group B (FB dB) corresponding to the front bass level variable FB is read out from the internal memory and the coefficient data $c_0$ to $c_4$ in the front bass coefficient data area of the coefficient RAM 7 are rewritten. In the rear mode, each time the bass up/down control key is operated, the rear bass level variable RB is changed by two. If the rear tone control level lies within the adjustable range, the bass coefficient data group B (RB dB) according to the rear bass level variable RB is read out from the internal memory and the coefficient data $c_0$ to $c_4$ in the rear bass coefficient data area of the coefficient RAM 7 are rewritten. On the other hand, in the common mode, each time the bass up/down control key is operated, the front bass level variable FB is changed by two. If the front tone control level lies within the adjustable range, the rear bass level variable RB is further changed by two. If the rear tone control level lies within the adjustable range, the bass coefficient data groups B (FB dB) and B (RB dB) corresponding to the front and rear bass level variables FB and RB are read out from the internal memory. The coefficient data $c_0$ to $c_4$ in the front and rear bass coefficient data areas in the coefficient RAM 7 are rewritten.

Therefore, by rewriting the coefficient data $c_0$ to $c_4$ as mentioned above, the bass characteristic of the front channel changes in the front mode, the bass characteristic of the rear channel changes in the rear mode, and the bass characteristics of both of the front and rear channels change in the common mode. In the common mode, in a state in which the level difference between the bass control level of the front channel which was set in the front mode and the bass control level of the rear channel which was set in the rear mode is maintained, the front and rear levels, that is, the bass characteristics of both channels change. On the other hand, in the common mode, if the tone control level has reached the upper or lower limit value in the adjustable level range in one of the channels, the sound level in the other channel is not changed any more, so that the level difference between the front and rear bass control levels is maintained.

The above operation has been described with respect to the adjustment of the bass sound. However, the same shall also apply to the adjustment of the treble sound. In the treble adjustment, each time the treble up/down control key of the keyboard 16 is operated, a front treble level variable FT is changed in the front mode, a rear treble level variable RT is changed in the rear mode, and values of the front and rear treble level variables FT and RT are changed in the common mode. If the values of the variables having been changed lie within the tone control adjustable ranges, a treble coefficient data group T (FT dB) corresponding to the variable FT is read out and written into the front treble coefficient data area of the RAM 7 in the case of the front mode. In the rear mode, a treble coefficient data group T (RT dB) corresponding to the variable RT is read out and written into the rear treble coefficient data area of the RAM 7. In the common mode, both of the treble coefficient data groups T (FT dB) and T (RT dB) are read out and written into the treble coefficient data areas of the RAM 7.

Figures 7A, 7B, 7C:
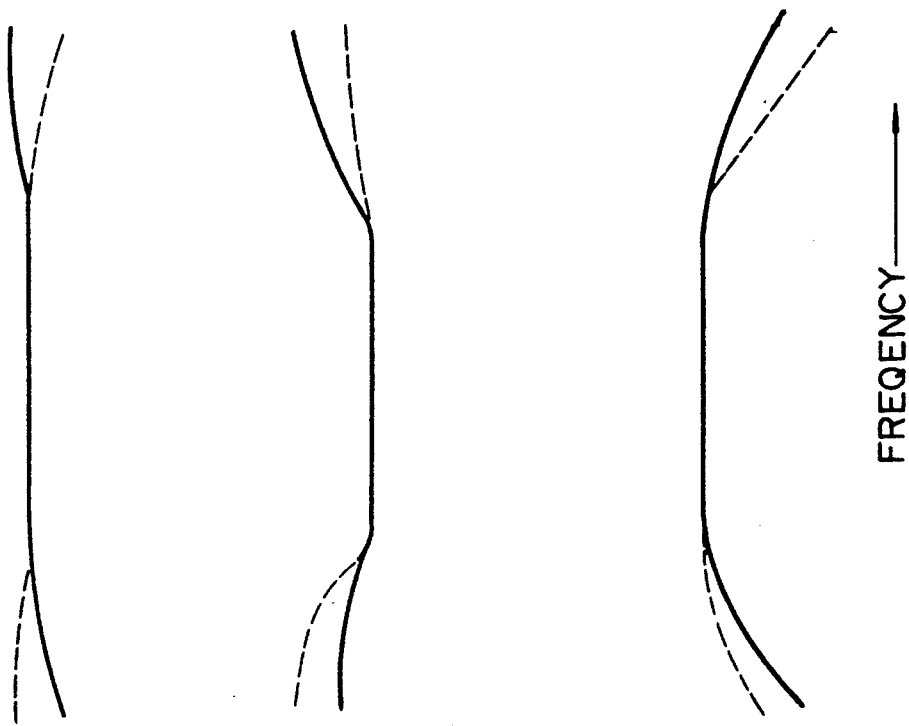
FIGS. 7A to 7C are frequency response characteristic diagrams showing the operations in a common mode.

For instance, in the case where the treble and bass characteristics (a solid line represents the characteristic of the front channel and a dashed line represents the characteristic of the rear channel) were individually adjusted for the front and rear channels in the front and rear modes as shown in FIG. 7A, if both of the bass and treble levels are boosted by operating the bass and treble up control keys in the common mode, as shown in FIG. 7B, the front and rear frequency characteristics change while maintaining the level difference between the front and rear bass control levels. On the other hand, in the common mode, if the bass and treble levels are lowered by operating the bass and treble down control keys, as shown in FIG. 7C, the front and rear frequency characteristics change while maintaining the level difference between the front and rear bass control levels.

In the embodiment described in the foregoing, if the tone control level has reached the upper or lower limit value in the adjustable level range in one of the channels in the common mode, the level of the other channel is not changed any more. However, it is also possible to construct in a manner such that the above restricting operation is canceled by another key operation and the further level change of only the other channel can be executed.

In the above embodiment, the apparatus has been formed by the digital processes using the DSP. However, as shown in FIG. 8, the apparatus can be also realized by an analog circuit in a manner such that a front independent tone control circuit 41, a front common tone control circuit 42, a rear independent tone control circuit 43, and a rear common tone control circuit 44 are provided, the tone control is independently performed in the front and rear channels by a bass control variable resistor 41a and a treble control variable resistor 41b of the tone control circuit 41 and by a bass control variable resistor 43a and a treble control variable resistor 43b of the tone control circuit 43, and the tone control is performed in an interlocking manner in the front and rear channels by a bass control variable resistor 42a and a treble control variable resistor 42b of the tone control circuit 42 and by a bass control variable resistor 44a and a treble control variable resistor 44b of the tone control circuit 44.

Although the above embodiments have been described with respect to one channel of stereophonic signals, the above calculating operations are repeated in both of the right and left channels, respectively.

As mentioned above, in the tone control apparatus according to the invention, the tone control can be independently performed in the front and rear channels. Therefore, in the case where the bass level of the rear channel is raised in the sound system having audio outputs of the front and rear channels, it is possible to prevent the generation of distortions in the acoustic output from the front speakers. On the other hand, in the onboard sound system, if the level of the treble sound is insufficient in the front seats, the treble level can be adjusted without giving an unpleasant feeling to the listener sitting near the rear speakers.

On the other hand, in the tone control apparatus according to the invention, by changing the tone control setting levels in an interlocking manner by a single operation while maintaining the tone control setting level difference between the front and rear channels, a good operating performance is maintained and a good tone control level balance between the front and rear channels can be maintained.

What is claimed is:

1. A tone control apparatus in a sound system processing audio signals of front and rear channels, comprising:

front tone control means for effecting a tone control operation for the audio signal of the front channel;

rear tone control means for effecting the tone control operation for the audio signal of the rear channel; and control means for operating said front and said rear tone control means, said control means including means for operating said rear tone control means independently of said front tone control means and for operating said front tone control means independently of said rear tone control means so as to vary a bass tone level and/or a treble tone level of one of said front or rear channels without also varying the base tone level and/or the treble tone level of the other one of said front or rear channels, wherein said control means operates, in a common mode of operation, said front and said rear tone control means to change tone control setting levels in an interlocking manner within a predetermined tone adjustable range in accordance with a single operation while maintaining a preexisting difference between the tone control setting level of said front channel and the tone control setting level of said rear channel, and when, in the common mode of operation, one of said tone control setting levels equals an upper or a lower limit value of said predetermined tone adjustable range, said control means operates to stop controlling also the other of said tone control setting levels.

2. A tone control apparatus in a sound system processing audio signals of front and rear channels, comprising:

front tone level control means for effecting a tone level control operation for the audio signal of the front channel, said front tone level control means including means for setting a bass tone level for the front channel and further including means for setting a treble tone level for the front channel;

rear tone level control means for effecting a tone level control operation for the audio signal of the rear channel, said rear tone level control means including means for setting a bass tone level for the rear channel and further including means for setting a treble tone level for the rear channel; and control means for operating said front and said rear tone level control means, said control means including means, responsive to a front bass control input signal received in a first mode of operation, for causing said front tone level control means to set only the bass tone level of the front channel in accordance with the front bass control input signal, said control means further being responsive to rear bass control input signal, received in the first mode of operation, for causing said rear tone level control means to set only the bass tone level of the rear channel in accordance with the rear bass control input signal, and wherein said control means further includes means, responsive to a front treble control input signal received in the first mode of operation, for causing said front tone level control means to set only the treble tone level of the front channel in accordance with the front treble control input signal, said control means further being responsive to a rear treble control input signal, received in the first mode of operation, for causing said rear tone level control means to set only the treble tone level of the rear channel in accordance with the rear treble tone level control signal, wherein said control means further includes means, responsive to a bass control input signal received in a second mode of operation, for causing said front tone level control means to set the bass tone level of the front channel in accordance with the bass control input signal and for causing said rear tone level control means to also set the bass tone level of the rear channel within a predetermined bass tone adjustable range so as to maintain a preexisting level difference between the bass tone level of the front channel and the base tone level of the rear channel and when, in said second mode of operation, one of said bass tone levels of said front and said rear channels equals an upper or a lower limit value of said predetermined bass tone adjustable range, causing said front and rear tone level control means to stop controlling the bass tone levels of the front and rear channels, and wherein said control means further includes means, responsive to a treble control input signal received in the second mode of operation, for causing said front tone level control means to set the treble tone level of the front channel in accordance with the treble control input signal and for causing said rear tone level control means to also set the treble tone level of the rear channel within a predetermined treble tone adjustable range so as to maintain a preexisting level difference between the treble tone level of the front channel and the treble tone level of the rear channel and when, in said second mode of operation, one of said treble tone levels of said front and said rear channels equals an upper or a lower limit value of said predetermined treble tone adjustable range, causing said front and rear tone level control means to stop controlling the treble tone levels of the front and rear channels.

3. A tone control apparatus as set forth in claim 2 wherein said control means operates said front tone level control means and said rear tone level control means so as to change said bass tone levels and said treble tone level by discrete steps within a predetermined range of steps.

4. A tone control apparatus as set forth in claim 3 wherein each of the discrete steps is equal to 2 dB.

5. A tone control apparatus as set forth in claim 3 wherein the predetermined range of steps is equal to 31 12 dB to +12 dB.

* * * * *